United States Patent
Shimojima et al.

(10) Patent No.: US 7,131,392 B2
(45) Date of Patent: Nov. 7, 2006

(54) VACUUM EVAPORATOR

(75) Inventors: Katuhiko Shimojima, Takasago (JP); Hirofumi Fujii, Takasago (JP); Hiroshi Kawaguchi, Takasago (JP)

(73) Assignee: Kobe Steel, Ltd., Kobe (JP)

( * ) Notice: Subject to any disclaimer, the term of this patent is extended or adjusted under 35 U.S.C. 154(b) by 0 days.

(21) Appl. No.: 10/879,584

(22) Filed: Jun. 30, 2004

(65) Prior Publication Data

US 2005/0005860 A1  Jan. 13, 2005

(30) Foreign Application Priority Data

Jul. 7, 2003  (JP) .............................. 2003-271248

(51) Int. Cl.
  *C23C 14/32*  (2006.01)
  *C23C 14/24*  (2006.01)
  *C23C 14/56*  (2006.01)
(52) U.S. Cl. .............................. 118/723 VE; 118/719; 118/729; 204/298.41
(58) Field of Classification Search ......... 118/723 VE, 118/719, 729, 730; 204/298.41
See application file for complete search history.

(56) References Cited

U.S. PATENT DOCUMENTS

| 5,232,507 A | * | 8/1993 | Ohtoshi et al. ............. 118/719 |
| 5,380,420 A | * | 1/1995 | Tsuji ..................... 204/298.41 |
| 5,730,847 A | * | 3/1998 | Hanaguri et al. ...... 204/298.41 |
| 6,296,747 B1 | | 10/2001 | Tanaka |
| 6,471,837 B1 | * | 10/2002 | Hans et al. ............. 204/298.41 |
| 2003/0111342 A1 | | 6/2003 | Choquette et al. |
| 2005/0229852 A1 | * | 10/2005 | Fanfani ................... 118/723 E |

FOREIGN PATENT DOCUMENTS

| GB | 1 082 562 | | 9/1967 |
| JP | 08-100253 | * | 4/1996 |
| JP | 09-157844 | * | 6/1997 |
| JP | 3195492 | | 6/2001 |
| WO | WO 2004/005576 | * | 1/2004 |

OTHER PUBLICATIONS

Webster's Third New International Dictinary, Merriam-Webster, 1993, pp. 153, 663 and 1730.*
Patent Abstracts of Japan, JP 59-013068, Jan. 23, 1984.

* cited by examiner

*Primary Examiner*—Richard Bueker
(74) *Attorney, Agent, or Firm*—Oblon, Spivak, McClelland, Maier & Neustadt, P.C.

(57) ABSTRACT

A vacuum evaporator according to the present invention comprises a vacuum chamber, a rod-like evaporation source provided to be liftable into and out of the vacuum chamber, and a work support means for supporting, relative to the evaporation source lowered into the vacuum chamber, works W arranged to surround the evaporation source. The vacuum chamber is formed of a fixed chamber part and a movable chamber part provided connectably to and disconnectably from the fixed chamber part and mounted with the work support means. Either one movable chamber part is horizontally moved and connected to the fixed chamber part in the state where the evaporation source is raised and retreated out of the vacuum chamber to perform vacuum evaporation treatment. According to such a structure, the maintenance of the vacuum evaporator can be performed without raising or lowering the lower plate or taking out the work support means from the vacuum chamber.

9 Claims, 6 Drawing Sheets

VACUUM EVAPORATOR

BACKGROUND OF THE INVENTION

1. Field of the Invention

The present invention relates to a vacuum evaporator for coating the surface of a work with a film by depositing a material evaporated from an evaporation source in vacuum atmosphere on the work surface.

2. Description of the Related Art

Arc ion plating (AIP) method is a form of vacuum evaporation method, in which an evaporation source is provided in a vacuum chamber as a cathode to generate vacuum arc discharge with an anode, and a cathode material is evaporated from the evaporation source and accumulated on the surface of a work housed in the vacuum chamber to coat the surface of the work with a film.

Conventional vacuum evaporators for executing the AIP method include, for example, a device disclosed in Japanese Patent No. 3195492. This device comprises a vacuum chamber, a rod-like evaporation source provided in the vacuum chamber, and work support means for supporting works arranged so as to surround the rod-like evaporation source. The vacuum chamber comprises a lower lid mounted on the work support means and a chamber body having the rod-like evaporation source fixed thereto, the lower lid being liftable relative to the body.

When recovering treated works in this device, the lower lid is lowered from the chamber body in a position not interfering therewith, and the work support means is horizontally moved from the lower lid to a recovery area. When supplying untreated works into the vacuum chamber, the untreated works are mounted on the work support means after recovery, the work support means is moved to above the lower lid, and the lower lid is raised and airtightly connected to the chamber body.

In this patent publication is also described, as another device form, a vacuum evaporator comprising a vacuum chamber, a rod-like evaporation source provided liftably into and out of the vacuum chamber, and work support means for supporting works arranged so as to surround the rod-like evaporation source, in which the vacuum chamber has an opening part airtightly openable by an opening and closing door. In this evaporator, the work support means loaded with the works can be moved in and out of the vacuum chamber through the opening part after the evaporation source is raised and retreated out of the vacuum chamber.

When recovering treated works in this device, the opening and closing door is opened after the evaporation source is raised and retreated out of the vacuum chamber, and the work support means is horizontally moved out of the vacuum chamber from the opening part. When supplying untreated works into the vacuum chamber, the untreated works are mounted on the work support means after recovery, and moved and housed in the vacuum chamber, and the opening and closing door is closed.

In each type of vacuum evaporator described above, the work support means generally has a rotary table rotating with works on board in order to uniformly coat the circumferential surface of the works, and the rotary table is driven by a drive mechanism provided on the lower lid side of the vacuum chamber.

The lower lid-raising/lowering type vacuum evaporator requires a large-scale lifting device in order to raise and lower the lower lid mounted on the work support means, and also a large lifting space. Further, the device structure becomes complicated because it is necessary to make the work support means movable from the lower lid and to interlock and connect the driving mechanism with the rotary table every recovery and supply of works.

On the other hand, in the evaporation source-raising/lowering type vacuum evaporator, the device structure also becomes complicated because it is necessary to move the work support means in and out of the vacuum chamber, although the large-scale lifting device or lifting space as in the above vacuum evaporator is not required.

Each type of vacuum evaporator has the problem of poor workability because of a limited working space in the cleaning of the inner surface of the vacuum chamber or the maintenance of various members such as anode provided in the vacuum chamber.

SUMMARY OF THE INVENTION

The present invention thus has been achieved from the viewpoint of such problems. The present invention provides a vacuum evaporator enabling the easy maintenance of the inner surface of a vacuum chamber and various members such as anode attached therein by dispensing with the raising and lowering of a lower lid or the taking-out and -in of work support means for supporting works.

Namely, the vacuum evaporator according to the present invention for depositing a material evaporated from an evaporation source on the surface of works to form a film thereon comprises the followings: a vacuum chamber, the vacuum chamber being formed of a fixed chamber part and a movable chamber part provided connectably to and disconnectably from the fixed chamber; a rod-like evaporation source mounted on the fixed chamber part, the evaporation source being provided movably into and out of the vacuum chamber; work support means, the work support means supporting the works arranged so as to surround the evaporation source moved into the vacuum chamber; and horizontally moving means for horizontally moving the movable chamber part connectably to and disconnectably from the fixed chamber part in the state where the evaporation source is moved and retreated out of the vacuum chamber.

According to this vacuum evaporator, the movable chamber part provided with the work support means can be separated from the fixed chamber part and horizontally moved to a retreat position by the horizontal moving means after the evaporation source is moved and retreated out of the vacuum chamber after vacuum evaporation treatment. Therefore, it is not necessary to separately take out the work support means from the vacuum chamber, and the taking-out of treated works from the work support means or the supply of untreated works thereto can be directly performed through a large dividing opening part of the movable chamber separated from the fixed chamber in the retreat position with excellent workability.

In this vacuum evaporator, two or more sets of the movable chamber part and the horizontal moving means can be provided. According to this, the movable chamber parts can be alternately used to perform vacuum evaporation treatment, and the productivity can be improved.

This vacuum evaporator further comprises, as the horizontally moving means, a horizontally rotational moving means for rotating and moving the movable chamber part around a rotating axis in the horizontal direction or a horizontally linear moving means for linearly moving the movable chamber part in the horizontal direction. Further, when two sets or more of the movable chamber parts and the horizontally moving means are provided, the horizontally rotational moving means and horizontally linear moving means may be provided in combination. By providing such a horizontally moving means, the movable chamber part can be easily connected to, separated from the fixed chamber part, and horizontally moved to the retreat position by rotational movement or linear movement.

The vacuum chamber can have a body part cylindrical as the whole, an upper plate for blocking an upper opening of the body part and a lower plate for blocking the lower opening of the body part. The fixed chamber part can include a center portion passing the axis of the vacuum chamber in the upper plate, the movable chamber part can include a center portion passing the axis of the vacuum chamber in the lower plate, and the fixed chamber part and the movable chamber part can be divided by a dividing plane passing the center portion of the body part.

By such a form where the dividing plane passes the center portion of the body part, a large dividing opening part can be easily formed in the fixed chamber part and the movable chamber part. Since the fixed chamber part includes the center portions passing the axis of the vacuum chamber, an inlet and outlet for the evaporation source can be formed in the center portion of the upper plate. Further, since the movable chamber part includes the center portions passing the axis of the vacuum chamber, the rotating shaft of the rotary table of the work support means can be provided in the center portion of the lower plate, and a rotation driving mechanism regularly interlocked and connected to the rotating shaft can be attached to the vicinity thereof. Therefore, the mounting structure and drive mechanism of the rotary table can be simplified, and a stable device structure well-balanced as the whole can be provided.

In the above vacuum evaporator, as the work support means, a one having a rotary table rotating around the axis of the evaporation source and a plurality of work retainers rotatably disposed on the outer circumferential upper part of the rotary table can be used. The movable chamber part can comprise a shield plate for suppressing the adhesion of a material evaporated from the evaporation source to the inner surface of the vacuum chamber. In an AIP vacuum evaporator, further, the movable chamber can comprise an anode plate for generating arc discharge with the evaporation source. A member such as the anode plate or shield plate is preliminarily provided on the movable chamber, whereby the maintenance of these members or the cleaning of the inner surface of each chamber part can be easily performed through the dividing opening part in the retreat position with excellent maintenance property.

DESCRIPTION OF THE PREFERRED EMBODIMENTS

Preferred embodiments of the present invention will be further described in reference to the drawings.

Figure 1:
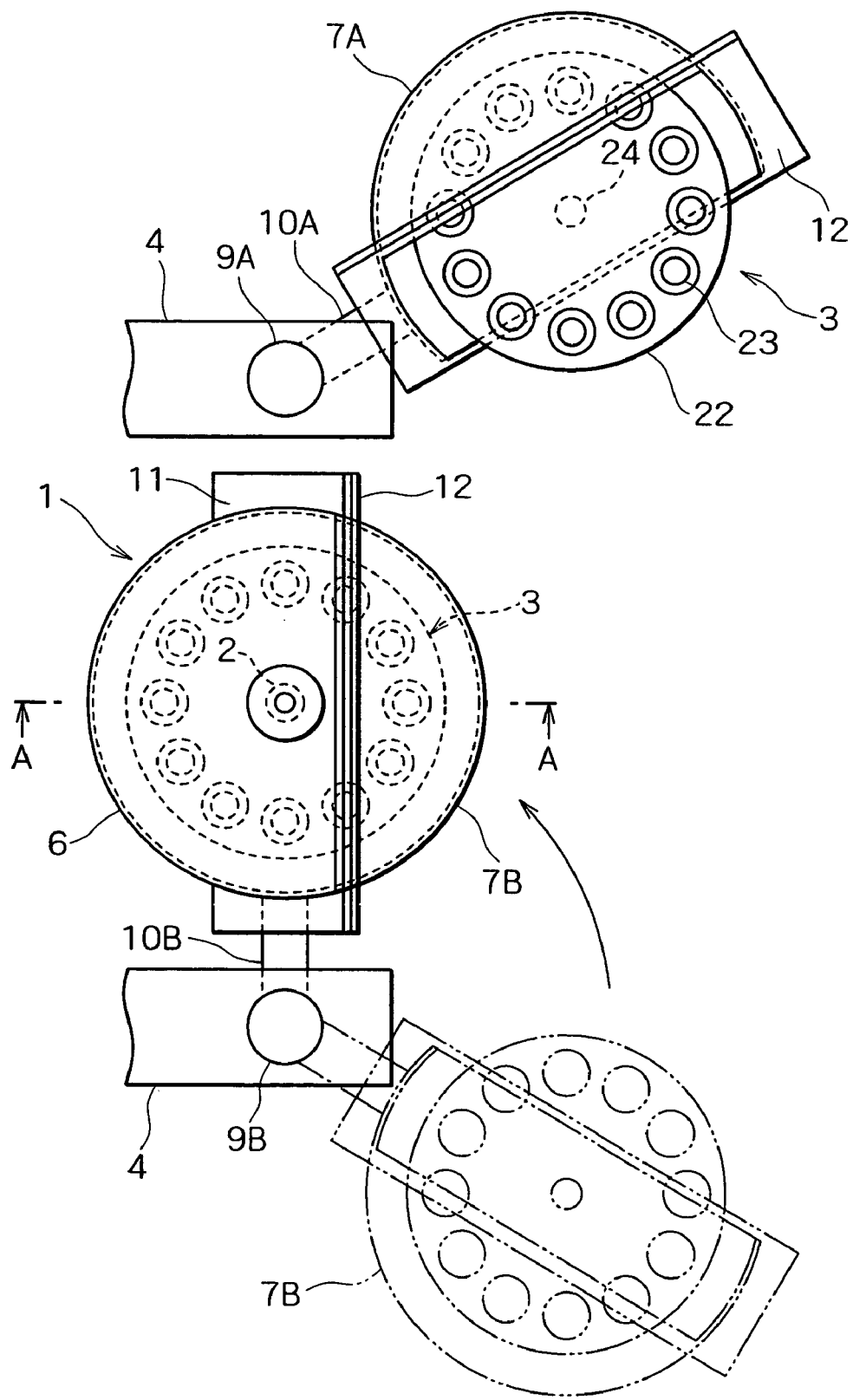
FIG. 1 is an entire plan view of an AIP vacuum evaporator according to a first embodiment of the present invention, which shows the process of vacuum evaporation treatment using a second movable chamber part.
Figure 2:
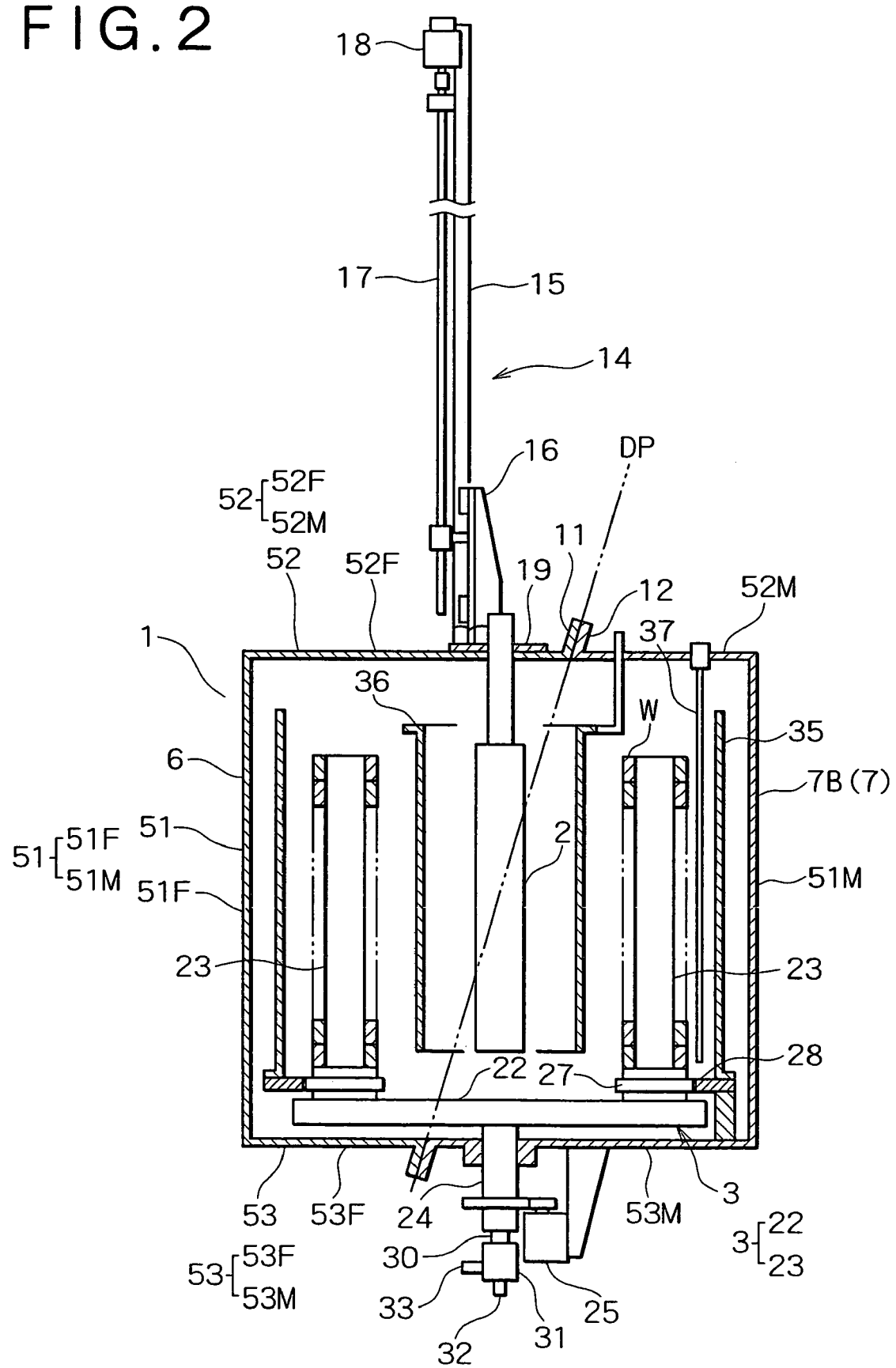
FIG. 2 is an essential sectional view (sectional view taken along line A—A of FIG. 1) of the vacuum evaporator of FIG. 1.
Figure 3:
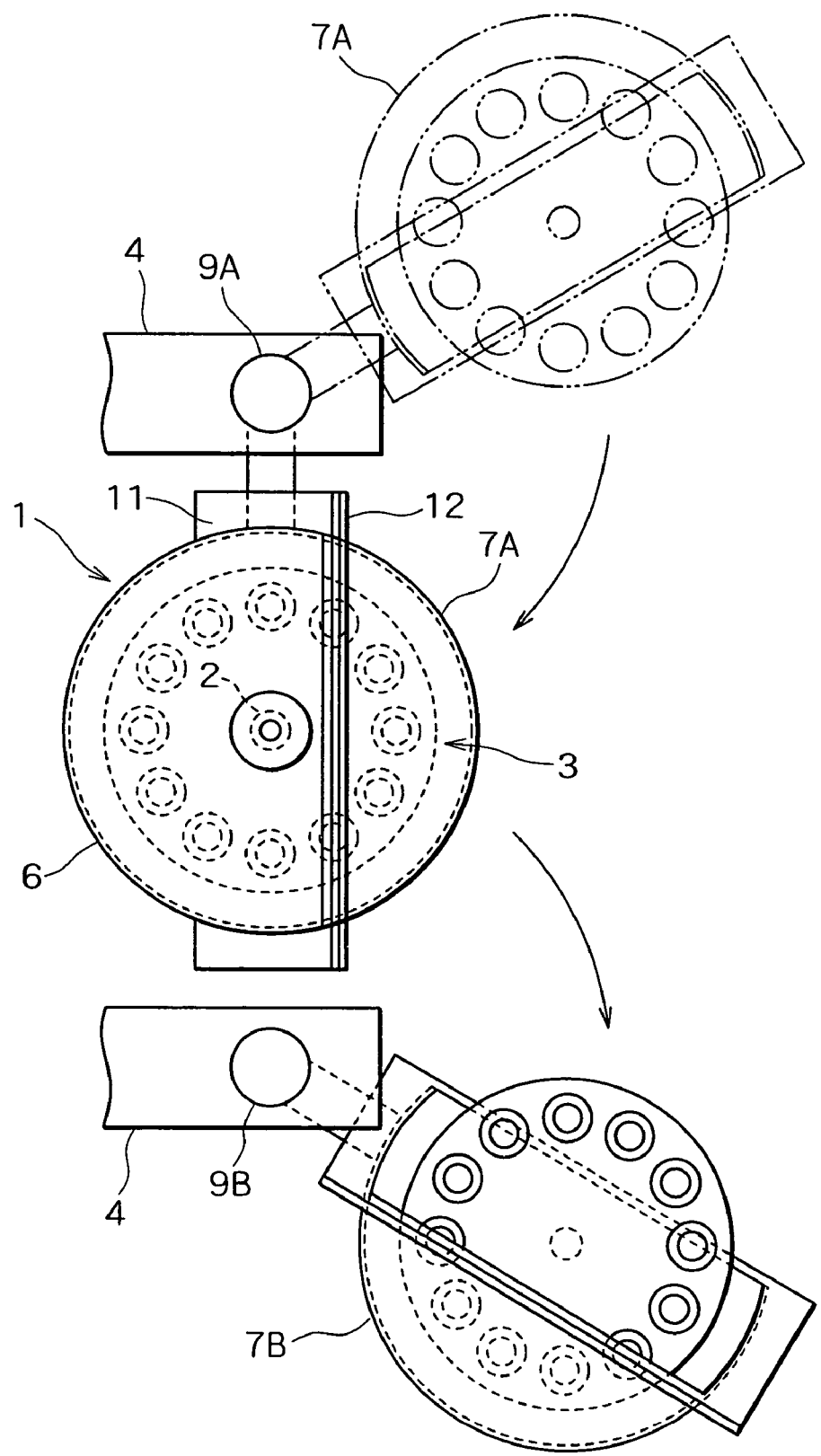
FIG. 3 is a plan view showing the process of vacuum evaporation treatment using a first movable chamber part in the vacuum evaporator of FIG. 1.

FIGS. 1 to 3 show an AIP vacuum evaporator according to a first embodiment in the order of use. The structure of this device is first described based on the using states shown in FIGS. 1 and 2.

This evaporator comprises a vacuum chamber 1, a rod-like evaporation source 2 provided to be vertically movable into and out of the chamber along the axis of the vacuum chamber 1, and work support means 3 for supporting, relative to the evaporation source 2 arranged in the vacuum chamber 1, works concentrically arranged so as to surround the evaporation source 2.

The vacuum chamber 1 is formed of a fixed chamber part 6 and two sets of movable chamber parts 7A, 7B arranged connectably to and disconnectably from the fixed chamber part 6. The fixed chamber part 6 and the two sets of movable chamber parts 7A, 7B are set on frames 4. For convenience in descriptions, the upper movable chamber part and the lower movable chamber part in FIG. 1 are called a first movable chamber part 7A and a second movable chamber part 7B, respectively, as occasion demands, and they are simply called the movable chamber part 7 when the discrimination of the both is not required. The same is true in other embodiments described later.

Supports 9A, 9B are rotatably disposed on the frames 4, 4 on either transverse directional side (the vertical direction of the drawing) relative to the front of the fixed chamber part 6. The supports 9A, 9B support the first and second movable chamber parts 7A, 7B through support arms 10A, 10B and function as the rotating shafts of the movable chamber parts 7A, 7B, respectively. Each support 9A, 9B is rotatable by driving means such as fluid pressure cylinder or motor (not shown). The first and second movable chamber parts 7A and 7B are connectable to and disconnectable from the fixed chamber part 6 by the rotation of each support 9A, 9B, and rotationally moved in the horizontal direction so as to be approachable and separable between a connecting position with the fixed chamber part 6 and a retreat position. The supports 9A, 9B constitute horizontally rotational moving means with the drive means or the like (not shown).

The vacuum chamber 1 comprises a body part 51 cylindrical as the whole, an upper plate 52 for blocking the upper opening of the body part 51 and a lower plate 53 for blocking the lower opening of the body part 51, in the state where either one movable chamber part 7 the second chamber part 7B in FIG. 1) is connected to the fixed chamber part 6. The vacuum chamber 1 has a form divided in two by a dividing plane DP. The plane DP includes a partition line of parting an upper plate fixed part 52F including the center portion passing the axis of the vacuum chamber 1 in the upper plate 52 from an upper plate movable part 52M that is the area other than the upper plate fixed part 52F, and a partition line of parting a lower plate moving part 53M including the center portion passing the axis in the lower plate 53 from a lower plate fixed part 53F that is the area other than the lower plate moving part 53M. And the plane DP intersects with the axis of the body part 51 (the axis of the vacuum chamber 1) within the body part 51. An inlet and outlet for raising and lowering the evaporation source 2 through is formed in the center portion of the upper plate 52. The fixed chamber part 6 is constituted by the upper plate fixed part 52F, the lower plate fixed part 53F, and the body fixed part 51F of the body part 51 mutually connecting the both. The movable chamber part 7 is constituted by the upper plate moving part 52M, the lower plate moving part 53M, and the body moving part 51M of the body part 51 mutually connecting the both. Flanges 11 and 12 having seals for ensuring the airtightness are attached to the division parts of the fixed chamber part 6 and the movable chamber part 7.

A lifting unit 14 for raising and lowering the evaporation source 2 into and out of the vacuum chamber 1 is attached to the fixed chamber 6. The lifting unit 14 comprises a lifting guide 15, a slider 16 provided movably along the lifting guide 15, a ball screw 17 for raising and lowering the slider 16 along the lifting guide 15, and a drive motor 18 for normally and reversely rotating the ball screw 17. The evaporation source 2 is mounted on the lower part of the slider 16. A blocking plate 19 for airtightly blocking the outlet and inlet for the evaporation source 2 opened in the upper plate 52 (the upper plate fixed part 52F) is also provided thereon in the arrangement of the evaporation source 2 in the vacuum chamber 1. The evaporation source 2 is raised and lowered between a treatment position within the vacuum chamber 1 and the retreat position out of the vacuum chamber 1. The lifting unit 14 is not necessarily attached to the fixed chamber part 6, and may be attached to, for example, the frame 4. The lifting unit 14 is omitted in FIG. 1 (not shown).

The work support means 3 is attached to the movable chamber part 7. The work support means 3 comprises a rotary table 22 supported rotatably around the axis of the vacuum chamber 1, and columnar work retainers 23 disposed at equal intervals on the circumferential part of the rotary table 22. The rotary table 22 is supported by a table support shaft 24 airtightly and rotatably provided in the center portion passing the axis of the vacuum chamber 1 of the lower plate 53 (the lower plate moving part 53M). A drive motor 25 is attached under the lower plate moving part 53M, and its output shaft is interlocked and connected to the table support shaft 24. The work retainers 23 retain a number of ring-like works W put one over another.

Each work retainer 23 is rotatably supported on the rotary table 22, and a rotation gear 27 is provided on the lower part of each of the work retainer 23. The gear 27 is meshed with a ring gear 28 (omitted in FIG. 1) mounted on the lower plate moving part 53M through a support base. Therefore, when the rotary table 22 is rotated, the work retainer 23 is rotated around the table support shaft 24 and also rotated around its own axis by the rotation gear 27. Accordingly, the outer circumferential surfaces of the works retained by the work retainers 23 are uniformly coated with the evaporated material.

The table support shaft 24 has a cooling water supply and discharge pipe 30 for water-cooling the rotary table 22 and the work retainers 23, and cooling water is supplied and discharged through a rotary joint 31. The cooling water supplied through the feed port 32 of the rotary joint 31 is carried in the cooling water supply and discharge pipe 30 and cooling passages provided in the table support shaft 24, the rotary table 22 and the work retainers 23, returned again to the cooling water supply and discharge pipe 30, and then discharged out through the discharge port 33 of the rotary joint 31.

A shield plate 35 (omitted in FIG. 1) is mounted on the lower plate moving part 53M of the movable chamber part 7 so as to surround the line of the work retainers 23 raised on the rotary table 22. The shield plate 35 can prevent the accumulation of the evaporated material emitted from the evaporation source 2 on the inner surface of the vacuum chamber 1 through the clearance of the works W retained by the work retainer 23 in vacuum evaporation. Although the shield plate 35 is not necessarily provided, the contamination of the inner surface of the vacuum chamber 1 with the evaporated material can be prevented by providing the shield plate 35, and the removing work thereof can be consequently reduced to improve the maintenance property.

An anode plate 36 (omitted in FIG. 1) is mounted on the upper plate moving part 52M so as to surround the outside of the evaporation source 2 on the inside of the line of the work retainers 23 when the evaporation source 2 is arranged in the vacuum chamber 1. The anode plate 36 is not necessarily required, and the vacuum chamber 1 having the fixed chamber part 6 connected and integrated to the movable chamber 7 itself can be taken as the anode. When the works W are present between the vacuum chamber 1 and the evaporation source 2 as in this embodiment, arc discharge stability is remarkably improved by providing the anode plate 36. In the drawing, a work-heating heater 37 is mounted on the upper plate moving part 52M so that a heating part is arranged between the works retained by the work retainers 23 and the shield plate 35. Although the evaporated material is accumulated also on the heater 37 by vapor deposition treatment, the maintenance property of the heater 37 is improved by providing it this on the movable chamber part 7.

An application example of the vacuum evaporator according to the first embodiment will be then described.

As shown in FIG. 1, either one movable chamber part (the second movable chamber part 7B in FIG. 1) is connected to the fixed chamber part 6 to constitute the vacuum chamber 1, the evaporation source 2 is lowered from the retreat position out of the vacuum chamber to the treatment position in the vacuum chamber by use of the lifting unit 14, and the vacuum chamber 1 is evacuated to perform vacuum evaporation treatment. After the vacuum evaporation treatment is ended, the evaporation source 2 is raised and retained in the retreat position, the second movable chamber 7B is separated from the fixed chamber part 6 by use of the horizontally rotational moving means as shown in FIG. 3, and the support 9B is rotated to rotationally move the chamber part 7B to the retreat position. In the retreat position, the treated works retained by the work retainers 23 are recovered through the dividing opening part of the second movable chamber part 7B, and untreated works are loaded. As occasion demands, a work such as the cleaning or replacement of the anode plate 36 or shield plate 35 attached to the second movable chamber 7B is performed. After the second movable chamber part 7B is moved from the fixed chamber part 6 side to the retreat position, the first movable chamber part 7A already loaded with untreated works and waiting in the retreat position is rotated toward the fixed chamber part 6 by use of the horizontally rotational moving means and airtightly connected to the fixed chamber part 6, as shown in FIG. 3, to constitute the vacuum chamber 1 by the first movable chamber part 7A and the fixed chamber part 6, and the evaporation source 2 is lowered to perform vacuum evaporation treatment. Thereafter, the second movable chamber part 7B and the first movable chamber part 4A are alternately used in the same manner to perform vacuum evaporation treatment. The first movable chamber part 7A and the second movable chamber part 7B are rotated together to the retreat position, whereby a wide work space can be formed in the front of the fixed chamber 6 to perform the cleaning and maintenance or the like of the fixed chamber part 6.

Since the work support means 3 used for supply and taking-out of works and the anode plate 36 or shield plate 35 to be maintenanced after vacuum evaporation treatment are attached to the movable chamber part 7, the movable chamber part 7 is separated from the fixed chamber part 6 after end of vacuum evaporation treatment, and rotationally moved to the retreat position, whereby various works can be easily performed there through the widely opened dividing opening part of the movable chamber part 7 as a prescribed member is mounted or after it is removed.

Since the work support means 3 is attached to the movable chamber part 7, the rotary table 22 and the drive mechanism including the drive motor 25 can be horizontally moved as they are regularly interlocked and connected together. Accordingly, the separation or connection of the rotary table 22 from or to the drive mechanism every recovery or supply of works is dispensed with, and the drive mechanism of the rotary table 22 can be simplified. In the cooling of the rotary table 22 or the like, cooling water can be carried from the table support shaft 24 to the rotary table 22 or the like or recovered through the cooling water supply and discharge pipe 30. Therefore, the cooling of the rotary table 22 or the work retainers 23 and also the cooling of the works W can be easily performed.

In the above embodiment, since two sets of movable chambers 7A and 7B are provided, a required work can be performed for one movable chamber (the first chamber part 7A in FIG. 1) in the retreat position while the other movable chamber (the second chamber part 7B in FIG. 1) is connected to the fixed chamber part 6 to perform vacuum evaporation treatment, and the preparation of the next vacuum evaporation treatment can be performed in advance. Therefore, two sets of movable chamber parts 7A and 7B can be alternately connected to the fixed chamber part 6 and used, and excellent productivity can be provided.

Other embodiments of the present invention will be further described. The same reference characters are given to the same structures as in the first embodiment to omit the descriptions, and different points are mainly described.

Figure 4:
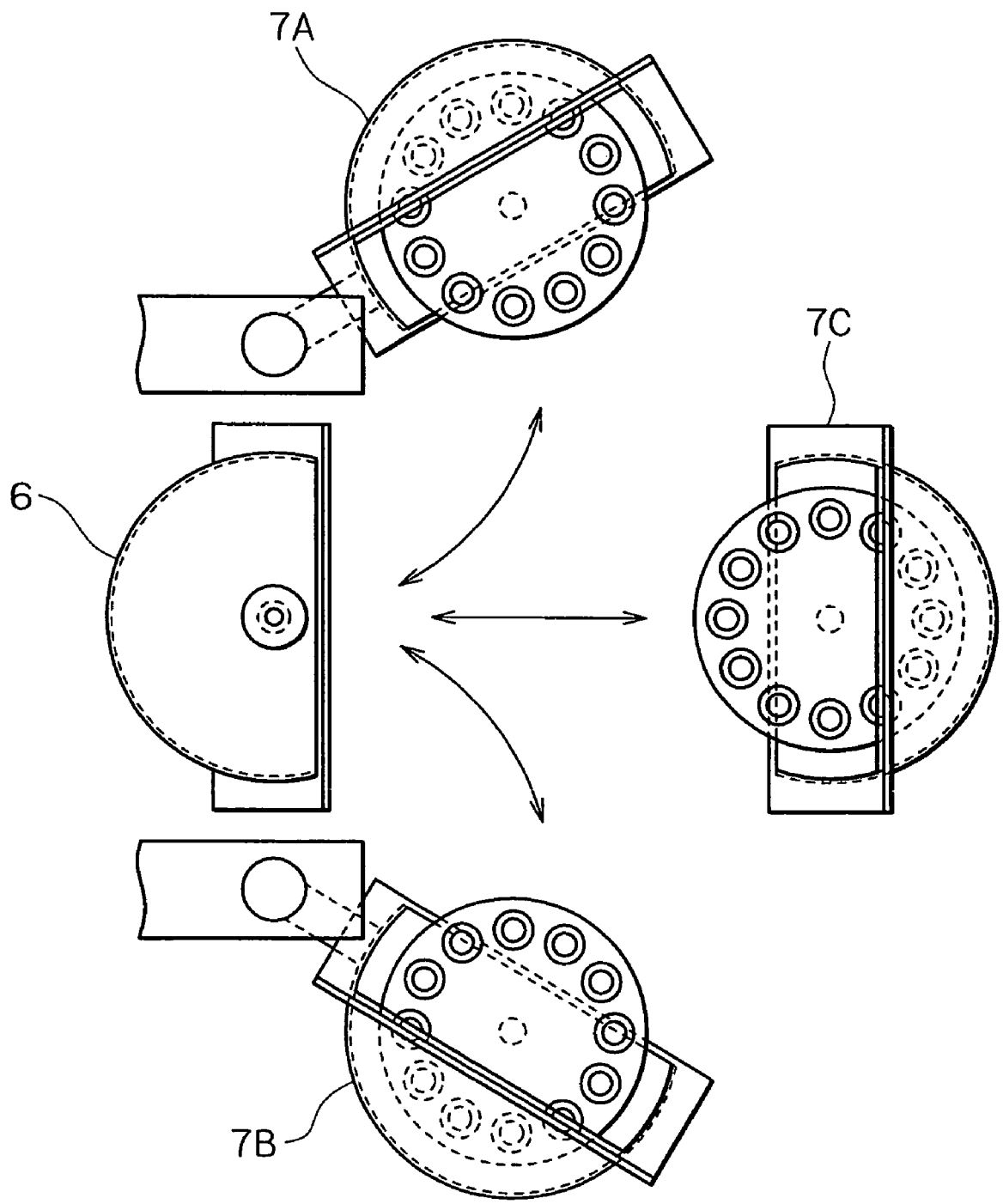
FIG. 4 is an entire plan view of an AIP vacuum evaporator according to a second embodiment of the present invention.

FIG. 4 shows the entire arrangement of an AIP vacuum evaporator according to a second embodiment. This device comprises two sets of first and second movable chamber parts 7A, 7B laterally rotated relative to the fixed chamber part 6 similarly to the first embodiment, and a third movable chamber part 7C linearly moved in the horizontal direction so as to be approachable and separable is provided in the front thereof. The third movable chamber part 7C is horizontally movable between the connecting position with the fixed chamber 6 part and the retreat position by a horizontally linear moving means (not shown) composed of a guide, a fluid pressure cylinder and the like.

In this embodiment, since three sets of movable chamber parts are provided, vacuum evaporation treatment can be performed by alternately using each movable chamber part 7A, 7B, 7C. Since the vacuum evaporation treatment can be performed by alternately using optional two sets of movable chamber parts, the remaining one set of movable chamber parts can be kept in reserve or subjected to a maintenance requiring a long time such as periodic inspection.

Figure 5:
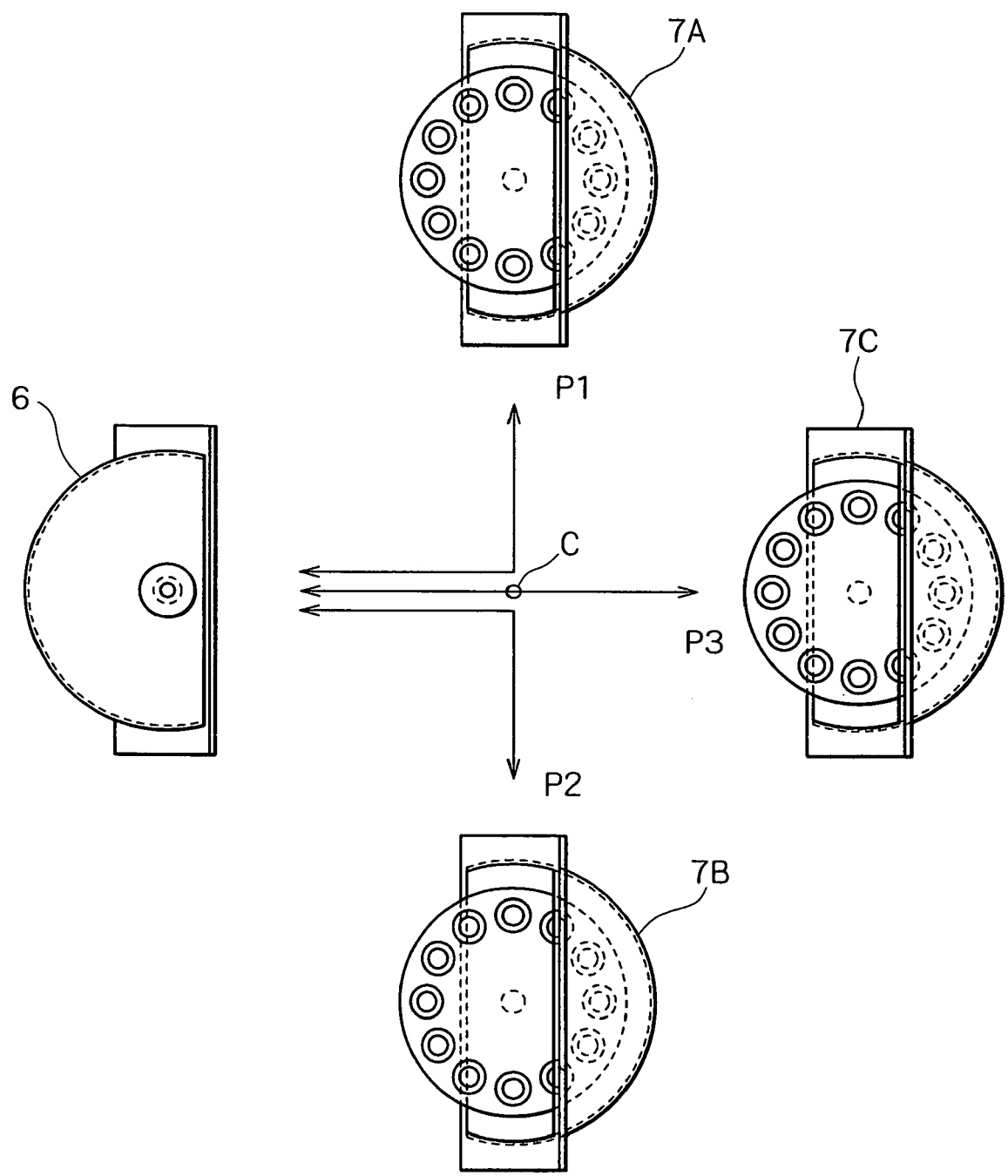
FIG. 5 is an entire plan view of an AIP vacuum evaporator according to a third embodiment of the present invention.

FIG. 5 shows the entire arrangement of an AIP vacuum evaporator according to a third embodiment. In this device, also, three sets of movable chamber parts 7A, 7B, 7C are provided for one fixed chamber part 6. Each movable chamber part is horizontally movable to a third retreat position P3 set backward in a direction right-angled to the connection surface of the fixed chamber part 6 (connecting/separating direction), or a first or second position P1, P2 set rightward or leftward relative to the connecting/separating direction by a horizontally linear moving means such as moving truck.

In this embodiment, the third movable chamber part 7C waiting in the third retreat position P3 is first horizontally linearly moved toward the fixed chamber part 6 and connected to the fixed chamber part 6 to perform vacuum evaporation treatment. After the vacuum evaporation treatment, the movable chamber part 7C is moved back to the third retreat position P3, and the first movable chamber part 7A loaded with untreated works retreated in the first retreat position P1 is horizontally moved toward the fixed chamber part 6 side via an intersection C and connected to the fixed chamber part 6 to perform vacuum evaporation treatment. On the other hand, in the third movable chamber part 7C moved back to the third retreat position P3, recovery of the treated works, supply of untreated works, and a proper maintenance are performed. When the vacuum evaporation treatment using the first movable chamber part 7A is ended, the first movable chamber part 7A is moved to the first retreat position P1, where the recovery of the treated works or the like is performed. The second movable chamber part 7B retreated to the second retreat position P2 and loaded with untreated works is connected to the fixed chamber part 6 via the intersection C to perform vacuum evaporation treatment. The vacuum evaporation treatment can be performed by successively using the first, second and third movable chamber parts 7A, 7B and 7C in this way. Further, the vacuum evaporation treatment can be performed by using other two sets of movable chamber parts while stopping either one set of movable chamber parts (for example, 7C) in the retreat position (P3).

In the third embodiment, three sets of movable chamber parts 7 are used. However, four sets or more may be used by setting proper retreat positions. A device structure consisting of the combination of the device of the first embodiment with the device of the fourth embodiment may be adapted.

In each embodiment described above, the fixed chamber part 6 and the movable chamber part 7 have forms divided by a dividing plane crossing the body part 51 of the vacuum chamber 1 obliquely from the upper plate 52 toward the lower plate 53. However, the dividing plane to the vacuum chamber 1 may be set to other forms without being by the above example. As the dividing form, as shown in FIGS. 6(1)–(5), various forms divided by the dividing plane passing through the center portion of the body part 51 of the vacuum chamber 1 can be adapted, wherein the fixed chamber part 6 includes the upper plate fixed part 52F including the center portion passing the axis of the vacuum chamber 1 in the upper plate, and the movable chamber part 7 includes the lower plate moving part 53M including the center portion passing the axis of the vacuum chamber 1 in the lower plate.

Figure 6:
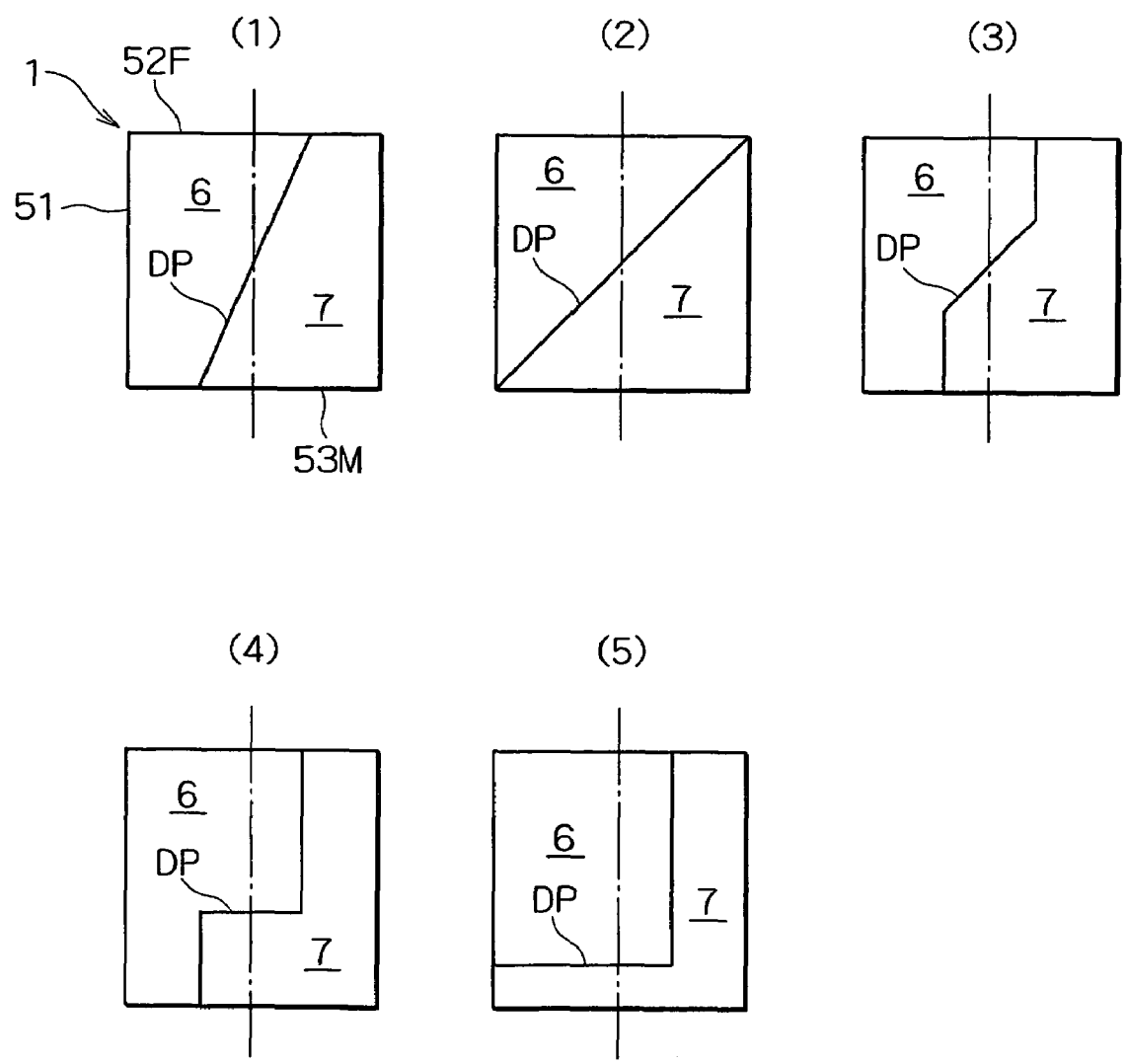
FIGS. 6(1)–(5) are side typical views of a vacuum chamber showing various dividing forms.

Namely, FIG. 6(1) shows an example of the dividing form of the above-mentioned embodiment, (2) shows an example divided by a dividing plane DP cutting the whole body part obliquely from the upper end toward the lower end, (3) shows an example of the form the body divided by a dividing plane DP cutting the body part vertically from the upper end toward the center portion, obliquely in the center portion and further vertically from the center portion toward the lower end, (4) shows an example divided by a bent dividing plane DP cutting the body part vertically from the upper end toward the center portion, transversely in the center portion and further vertically toward the lower end, and (5) shows an example divided by a dividing plane DP cutting the body part vertically from the upper end toward the lower part and transversely in the lower part.

In every case, since the dividing plane passes the center portion of the body part 51, a large dividing opening part can be formed. Further, the fixed chamber part 6 has the upper plate fixed part 52F including the center portion passing the axis of the vacuum chamber 1, the inlet and outlet port for the evaporation source can be formed in the center portion, and the lifting unit for raising and lowering the evaporation source can be attached. Since the movable chamber part 7 also has the lower plate moving part 53M including the center portion passing the axis, the table support shaft of the rotary table can be provided through in the center portion of the lower plate, and its rotational drive part can be attached. Dividing forms of the type in which the connection parts (dividing opening edge part) of the fixed chamber part 6 and the movable chamber part 7 mutually abut on in all portions in the connection of the movable chamber part 7 to the fixed chamber part 6 ((1) to (3) in FIG. 6) are adapted, whereby the advantage that the ensuring of airtightness in the connection parts is facilitated can be provided. The dividing form of the fixed chamber part 6 and the movable chamber part 7 is not limited by those shown in FIG. 6. For example, the movable chamber part 7 can be constituted by a plurality of parts. In this case, however, since the structure is complicated, and the airtightness between parts must be ensured. Accordingly, the dividing form of the vacuum chamber 1 is preferably set to a two-divided form.

In the above-mentioned embodiments, the horizontally moving means for horizontally moving the movable chamber part is adapted. Its moving direction may be substantially horizontal. In the horizontally moving means referred to herein, the movable chamber part may be moved in a direction slightly inclined from the horizontal direction.

The above-mentioned embodiments show examples of AIP vacuum evaporator. However, the present invention can be suitably applied to a surface treatment device for forming a film on the surface of a work by an evaporated material released from an evaporation source, for example, a sputtering vacuum evaporator without being limited to the use for AIP.

The present invention can be suitably applied to a vacuum evaporator for coating the surface of a work with a film by accumulating an evaporated material released from an evaporation source in vacuum atmosphere, for example, an arc ion plating device or sputtering device.

We claim:

1. A vacuum evaporator for depositing a material evaporated from an evaporation source on the surface of works to form a film, comprising:
    a vacuum chamber, said vacuum chamber being formed of a cylindrical body having a central longitudinal axis and comprised of a fixed chamber part of said cylindrical body and a movable chamber part of said cylindrical body provided connectably to and disconnectably from said fixed chamber part;
    a rod-like evaporation source mounted on said fixed chamber part, said evaporation source being provided movably into and out of said vacuum chamber;
    work support means mounted on said movable chamber part, said work support means supporting said works arranged so as to surround said evaporation source moved into said vacuum chamber;
    horizontally moving means for horizontally moving said movable chamber part connectably to and disconnectably from said fixed chamber part in the state where said evaporation source is moved and retreated out of said vacuum chamber;
    an upper plate for blocking an upper opening of said cylindrical body; and
    a lower plate for blocking a lower opening of said cylindrical body,
    wherein said fixed chamber part includes a center point of the upper plate, the center point of the upper plate being intersected by the central longitudinal axis of the cylindrical body, and said movable chamber part includes a center point of the lower plate, the center point of the lower plate being intersected by the central longitudinal axis of the cylindrical body; wherein said fixed and movable chamber parts have sealing surfaces that form a seal when connected together; and wherein said fixed and movable chamber parts are divided at a dividing plane defined by said seal and said dividing plane passing through the central longitudinal axis at an angle.

2. The vacuum evaporator according to claim 1, wherein two or more sets of said movable chamber part and said horizontally moving means are provided.

3. The vacuum evaporator according to claim 1, wherein said horizontally moving means horizontally rotates and moves said movable chamber part around a rotating axis.

4. The vacuum evaporator according to claim 2, wherein said horizontally moving means, in at least one of said two or more sets, horizontally rotates and moves said movable chamber part around a rotating axis.

5. The vacuum evaporator according to claim 1, wherein said horizontally moving means linearly moves said movable chamber part in the horizontal direction.

6. The vacuum evaporator according to claim 1, wherein said work support means has a rotary table rotatable around the axis of said evaporation source, and a plurality of work retainers rotatably raised on the circumferential upper part of said rotary table.

7. The vacuum evaporator according to claim 1, wherein said movable chamber part comprises a shield plate for preventing the adhesion of the material evaporated from said evaporation source to the inner surface of said vacuum chamber.

8. The vacuum evaporator according to claim 1, wherein said movable chamber part comprises an anode plate for generating arc discharge with said evaporation source.

9. The vacuum evaporator according to claim 1, wherein said movable chamber part comprises a work-heating heater.

* * * * *